(12) United States Patent
Marsh

(10) Patent No.: US 9,023,711 B2
(45) Date of Patent: *May 5, 2015

(54) METHODS FOR FORMING A CONDUCTIVE MATERIAL AND METHODS FOR FORMING A CONDUCTIVE STRUCTURE

(71) Applicant: Micron Technology, Inc., Boise, ID (US)

(72) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/277,507

(22) Filed: May 14, 2014

(65) Prior Publication Data

US 2014/0248771 A1 Sep. 4, 2014

Related U.S. Application Data

(63) Continuation of application No. 12/274,169, filed on Nov. 19, 2008, now Pat. No. 8,753,933.

(51) Int. Cl.
*H01L 21/20* (2006.01)
*H01L 21/768* (2006.01)
*C23C 16/04* (2006.01)
(Continued)

(52) U.S. Cl.
CPC ............ *H01L 21/7687* (2013.01); *C23C 16/04* (2013.01); *C23C 16/18* (2013.01); *H01L 21/2855* (2013.01); *H01L 23/5223* (2013.01); *H01L 27/10852* (2013.01);
(Continued)

(58) Field of Classification Search
CPC .................... H01L 21/3141; H01L 21/01078; H01L 28/40; H01L 28/60
USPC ......... 438/239, 243, 253, 256, 396, 399, 625, 438/674–675, 685
See application file for complete search history.

(56) References Cited

U.S. PATENT DOCUMENTS 5,270,241 A 12/1993 Dennison et al.
5,320,978 A 6/1994 Hsu
(Continued)

FOREIGN PATENT DOCUMENTS

CN 1378288 A 11/2002
JP 60111421 A 6/1985
(Continued)

OTHER PUBLICATIONS

"Diazonaphthoquinone," Wikipedia, <<http://en.wikipedia.org/wiki/Diazonaphthoquinone>> Mar. 8, 2013, 2 pages.
(Continued)

*Primary Examiner* — Thanhha Pham
(74) *Attorney, Agent, or Firm* — TraskBritt

(57) ABSTRACT

A method of forming a conductive material comprises forming at least one opening extending through an organic material and an insulative material underlying the organic material to expose at least a portion of a substrate and a conductive contact in the substrate. The method further comprises lining exposed surfaces of the insulative material, the conductive contact, and the at least a portion of the substrate in the at least one opening with a conductive material without forming the conductive material on the organic material.

19 Claims, 4 Drawing Sheets

(51) Int. Cl.
*C23C 16/18* (2006.01)
*H01L 21/285* (2006.01)
*H01L 23/522* (2006.01)
*H01L 27/108* (2006.01)
*H01L 49/02* (2006.01)

(52) U.S. Cl.
CPC .............. *H01L 28/65* (2013.01); *H01L 28/91* (2013.01); *H01L 2924/12044* (2013.01)

(56) References Cited

U.S. PATENT DOCUMENTS

| | | | |
|---|---|---|---|
| 5,891,804 | A | 4/1999 | Havemann et al. |
| 6,569,689 | B2 | 5/2003 | Marsh |
| 6,756,260 | B2 | 6/2004 | Lee |
| 6,812,133 | B2 | 11/2004 | Takeuchi |
| 6,824,816 | B2 | 11/2004 | Aaltonen et al. |
| 6,825,129 | B2 | 11/2004 | Hong |
| 6,838,339 | B2 | 1/2005 | Lee |
| 6,861,693 | B2 | 3/2005 | Derderian |
| 6,867,449 | B2 | 3/2005 | Marsh et al. |
| 6,984,301 | B2 | 1/2006 | Collins et al. |
| 7,018,933 | B2 | 3/2006 | Kim et al. |
| 7,157,783 | B2 | 1/2007 | Marsh |
| 7,189,615 | B2 | 3/2007 | Rao et al. |
| 7,226,861 | B2 | 6/2007 | Uhlenbrock et al. |
| 7,332,426 | B2 | 2/2008 | Ikeda et al. |
| 7,482,281 | B2 | 1/2009 | Fujii et al. |
| 8,753,933 | B2 * | 6/2014 | Marsh ........................ 438/239 |
| 2001/0019885 | A1 | 9/2001 | Marsh |
| 2002/0115284 | A1 | 8/2002 | Wu et al. |
| 2004/0043578 | A1 | 3/2004 | Marsh |
| 2004/0147103 | A1 | 7/2004 | Li et al. |
| 2005/0272247 | A1 | 12/2005 | Ikeda et al. |
| 2006/0115983 | A1 | 6/2006 | Fujii et al. |
| 2006/0128150 | A1 | 6/2006 | Gandikota et al. |
| 2006/0172530 | A1 | 8/2006 | Cheng et al. |
| 2007/0040276 | A1 | 2/2007 | Yang et al. |
| 2007/0042597 | A1 | 2/2007 | Yamazaki |
| 2007/0077441 | A1 | 4/2007 | Marsh |
| 2007/0077757 | A1 | 4/2007 | Shim |
| 2009/0218691 | A1 | 9/2009 | Yang et al. |
| 2010/0124821 | A1 | 5/2010 | Marsh |

FOREIGN PATENT DOCUMENTS

| | | | |
|---|---|---|---|
| JP | 02178922 | A | 7/1990 |
| JP | 05074963 | A | 3/1993 |
| JP | 06029246 | A | 2/1994 |
| JP | 06053331 | A | 2/1994 |
| JP | 08046152 | A | 2/1996 |
| JP | 09020980 | A | 1/1997 |
| JP | 11074354 | A | 3/1999 |
| JP | 2000183064 | A | 6/2000 |
| JP | 2000269163 | A | 9/2000 |
| JP | 2001160616 | A | 6/2001 |
| JP | 2001210802 | A | 8/2001 |
| JP | 2001353412 | A | 12/2001 |
| TW | 200414425 | | 8/2004 |
| TW | 200705612 | | 2/2007 |
| TW | 200721381 | | 6/2007 |
| WO | 0219398 | A2 | 3/2002 |

OTHER PUBLICATIONS

"Dow, Epoxy Novolac Resins," <<http://msdssearch.dow.com/PublishedLiteratureDOWCOM/dh_0030/0901b8038003042d.pdf?filepath=/296-00279.pdf&fromPage=GetDoc>> Oct. 1998, pp. 1-26.
"Glutarimide, N-methyl-, CAS No. 25077-25-2", chemmindustry, <<http://www.chemindustry.com/chemicals/01703657.html>> 1999, 1 page.
"Methylsilane," <<http://en.wikipedia.org/wiki/Methylsilane>> Mar. 22, 2013, 2 pages.
"Neoprene," Wikipedia, <<https://en.wikipedia.org/wiki/Neoprene>> Oct. 20, 2013, 5 pages.
"Novolak," Wikipedia <<http://de.wikipedia.org/wiki/Novolak>> Jul. 31, 2013, 1 page.
"Phenol formaldehyde resin," Wikipedia, <<http://en.wikipedia.org/wiki/Phenol_formaldehyde_resin>> Oct. 20, 2013, 4 pages.
"Poly(4-vinylphenol), Product No. 436224," Sigma-Aldrich, Product Specification, <<http://www.sigmaaldrich.com/catalog/product/aldrich/436224?lang=en&region=US>> Accessed Oct. 2013, 1 page.
"Poly(methyl methacrylate)," Wikipedia, <<http://en.wikipedia.org/wiki/Poly(methyl_methacrylate)>> Oct. 5, 2013, 10 pages.
"Polyacrylamide," Wikipedia, <<http://en.wikipedia.org/wiki/Polyacrylamide>> Oct. 4, 2013, 4 pages.
"Polydimethylsiloxane," Wikipedia, <<http://en.wikipedia.org/wiki/Polydimethylsiloxane>> Oct. 8, 2013, 7 pages.
"Polyurethane," Wikipedia, <<http://en.wikipedia.org/wiki/Polyurethane>> Oct. 17, 2013, 9 pages.
"Polyvinyl acetate," Wikipedia, <<http://en.wikipedia.org/wiki/Polyvinyl_acetate>> Sep. 26, 2013, 2 pages.
"Polyvinyl chloride," Wikipedia, <<https://en.wikipedia.org/wiki/Polyvinyl_chloride>> Oct. 21, 2013, 18 pages.
"Polyvinyl ether, Product No. 182729," Sigma-Aldrich, Product Specification, <<http://www.sigmaaldrich.com/Graphics/COfAInfo/SigmaSAPQM/SPEC/18/182729/182729-BULK ALDRICH.pdf>>; Sep. 8, 2010, 1 page.
"Sodium polyacrylate," Wikipedia, <<http://en.wikipedia.org/wiki/Sodium_polyacrylate>> Mar. 31, 2013, 2 pages.
Chen et al., Highly Stable Monolayer Resists for Atomic Layer Deposition on Germanium and Silicon, Chem. Mater., 2006, vol. 18, pp. 3733-3741.
Elina Farm et al., Selective-Area Atomic Layer Deposition Using Poly(methyl methacrylate) Films as Mask Layers, Journal of Physical Chemistry C, vol. 112, No. 40, Oct. 9, 2008, pp. 15791-15795.
Extended EP Search Report for European Application No. 09828004, dated May 31, 2013, 10 pages.
International Search Report, International Patent Application No. PCT/US2009/063440, Jun. 1, 2010, three (3) pages.
International Written Opinion of the International Searching Authority, International Patent Application No. PCT/US2009/063440, Jun. 1, 2010, five (5) pages.
International Preliminary Report on Patentability for International Application No. PCT/US2009/063440, dated May 24, 2011, 6 pages.
Office Action and Search Report of the Taiwan Intellectual Property Office, ROC (Taiwan) Patent Application No. 098139026, issued Feb. 13, 2014, nine (9) pages.
Sinha et al., Area Selective Atomic Layer Deposition: Use of Lithographically Defined Polymer Masking Layers for the Deposition of Titanium Dioxide, Advances in Resist Technology and Processing XXII, Proceedings of SPIE vol. 5753, Bellingham, WA, 2005, pp. 477-486.

* cited by examiner

US 9,023,711 B2

METHODS FOR FORMING A CONDUCTIVE MATERIAL AND METHODS FOR FORMING A CONDUCTIVE STRUCTURE

CROSS-REFERENCE TO RELATED APPLICATION

This application is a continuation of U.S. patent application Ser. No. 12/274,169, filed Nov. 19, 2008, now U.S. Pat. No. 8,753,933, issued on Jun. 17, 2014, the disclosure of which is hereby incorporated herein in its entirety by this reference.

TECHNICAL FIELD

The invention, in various embodiments, relates generally to methods for selectively forming a conductive material, such as platinum, to methods for forming a conductive material, and to methods of forming a conductive structure.

BACKGROUND

In the fabrication of integrated circuits, various conductive layers are used. For example, during the formation of semiconductor devices, such as, dynamic random access memories (DRAMs), static random access memories (SRAMs), ferroelectric (FE) memories, and NAND, conductive materials are used in the formation of storage cell capacitors as well as in interconnection structures and conductive lines. Thus, formation of conductive materials is an important fabrication process in integrated circuit (IC) production.

The requirements of forming the conductive material may be demanding, since conductive films need to be deposited at reasonably low temperatures tolerated by other materials used in the integrated circuits. In addition, high quality conformal films of the conductive material are often used to cover a highly varied topography on the integrated circuits for forming various conductive structures, such as openings, deep trenches, and container capacitor openings. Furthermore, such films need to be formed with high throughput.

For example, conventional storage cells include two conductive electrodes and a dielectric material interposed therebetween, and are often referred to as "metal-insulator-metal" (MIM) storage cell capacitors. One or more layers of various conductive materials may be used in forming the conductive electrodes. As capacitors decrease in size, the thickness of the dielectric material must be decreased to increase gate capacitance. Decreasing the thickness of conventional dielectric materials, such as silicon dioxide, may result in increased leakage current and reduced reliability of the device. Utilizing a high dielectric constant material between the two conductive electrodes enables increased gate capacitance without the concomitant leakage effects. The use of conductive materials such as platinum, rhodium, iridium, osmium, and alloys thereof, has been proposed for such MIM storage cell capacitors.

Many storage cell capacitors are fabricated which include electrode layers that are formed of a conductive material within a small, high aspect ratio opening. The term "aspect ratio" relates to the depth or height of a structure of an integrated circuit in relation to its width. Most often, platinum is used as the conductive material because platinum a high work function metal that generally reduces leakage in the cell. However, the lack of a practical etching process to remove platinum poses problems during capacitor fabrication. Conventional techniques used to form a platinum electrode include depositing the platinum, followed by CMP (chemical-mechanical polishing) or ion milling to remove extraneous portions of the platinum. However, these techniques may results in undesirable defects in the platinum electrode.

Referring to FIGS. 1A-1C, a conventional method of forming a semiconductor structure 100 including a container-type cell capacitor on a substrate 102 is illustrated. As shown in FIG. 1A, a substrate 102 may include a contact 104 formed therein and may, optionally, be in electrical contact with an underlying interconnect structure (not shown). A dielectric material 106 may be formed over the contact 104 and the substrate 102 and may be formed from materials such as, for example, silicon dioxide ($SiO_2$). A mask material 108 is formed over and in contact with the dielectric material 106 and is patterned to form an aperture (not shown) exposing a region of the dielectric material 106 where it is desired to form a capacitor structure. An opening 110 may be formed using an etching process that selectively removes the dielectric material 106 with respect to the mask material 108.

Thereafter, as shown in FIG. 1B, a conductive material 112 to be used for forming a bottom electrode of the cell capacitor is formed within the opening 110 and on the upper surface of the dielectric material 106. An oxide material 114 may then be applied over the semiconductor structure 100. The oxide material 114 and horizontal portions of the conductive material 112 overlying the dielectric material 106 may then be planarized or etched to form a bottom electrode 116. Ideally, an upper surface of the bottom electrode 116 is coplanar with an upper surface of the dielectric material 106.

However, during planarization, the conductive material 112 may be pushed into the center of the opening 110, resulting in deformation 118 as shown in FIG. 1C. The deformation 118 in the conductive material 112 produces an undesirable profile, which interferes with the formation of additional materials on the semiconductor structure 100. A further problem occurs where the conductive material 112 is exposed to an etching process to form the bottom electrode 116. During the etch, photoresist material 120 is formed over the conductive material 112 and patterned to expose regions of the conductive material 112 to be etched. Upon etching the conductive material 112 back to the dielectric material 106, the photoresist layer 120 may pull back away from the conductive material 112, causing surface regions 122 of the conductive material 112 to be undesirably etched.

To achieve higher-density memory arrays, methods for forming conductive materials and structures suitable for fabricating complex devices with the required enhanced density and reliability to meet future demands are needed.

DETAILED DESCRIPTION

Figure 1A:
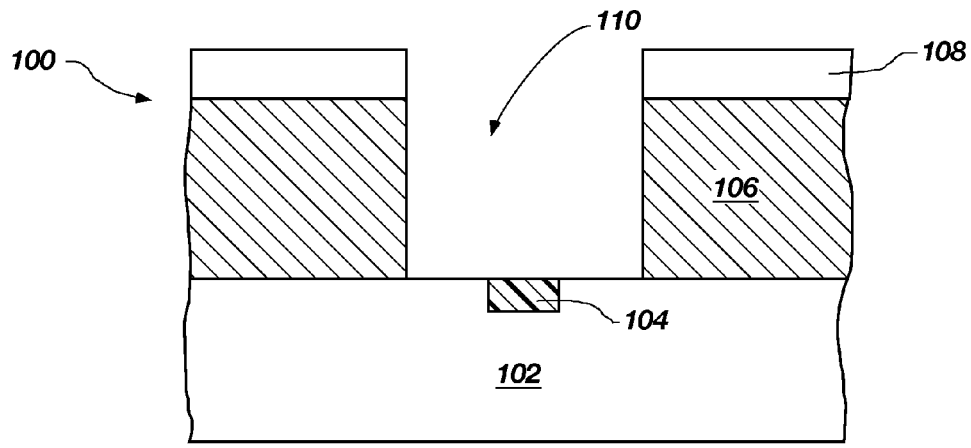
FIGS. 1A-1C are partial cross-sectional views illustrating a conventional method of forming a bottom electrode on a semiconductor structure.
Figure 1B:
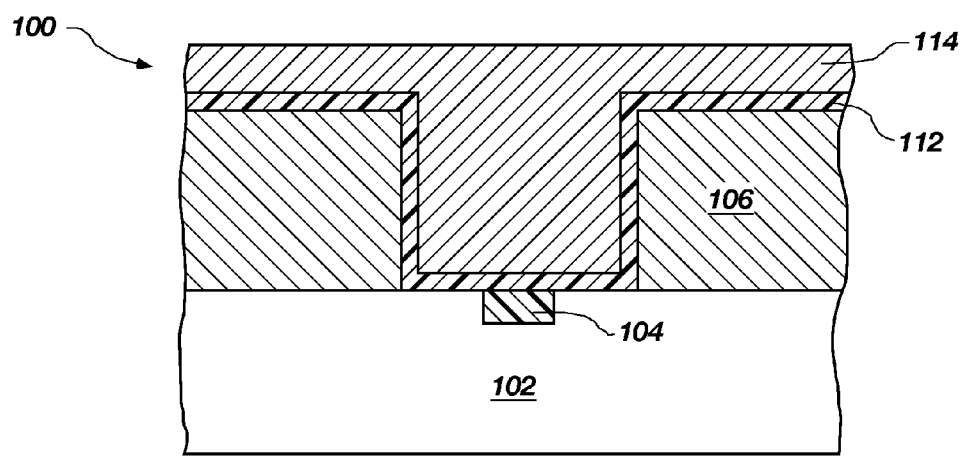
Figure 1C:
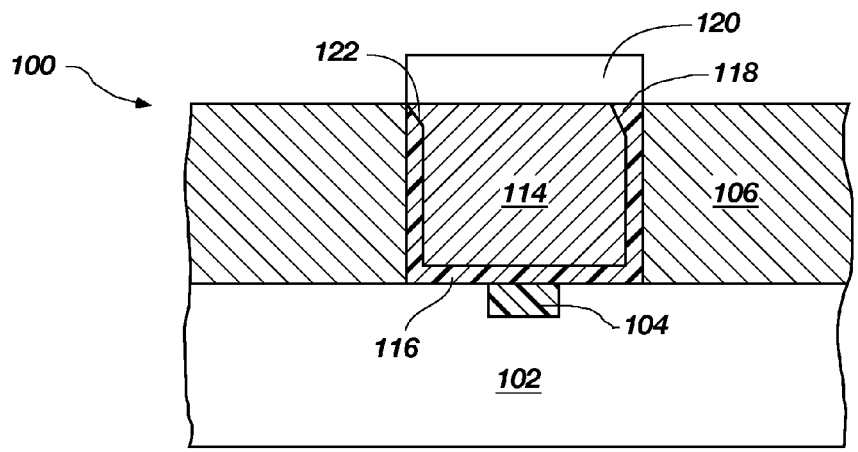

As discussed in further detail below, in some embodiments the present invention includes methods for selective formation of a conductive material, such as platinum. The conductive material may be selectively formed on at least one of a substrate and insulative material relative to an organic material. The conductive material may be formed using an atomic layer deposition process by reacting a surface on which it is desired to form the conductive material with a precursor gas while remaining regions of the surface are protected by the organic material, such as a photoresist material. In additional embodiments, the present invention comprises a method for forming conductive structures by applying an organic material over an insulative material overlying a substrate. At least one opening is formed that extends through the organic material and the insulative material to expose the substrate. The insulative material and substrate are subjected to a precursor gas that selectively reacts with the insulative material and substrate to form at least one conductive material thereon without reacting with the organic material. A dielectric material is formed over the at least one conductive material and another conductive material is formed over the dielectric material, producing at least one capacitor structure.

As used herein, the term "substrate" means and includes a base material or construction upon which additional materials are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The following description provides specific details, such as material types, material thicknesses, and processing conditions in order to provide a thorough description of embodiments of the invention. However, a person of ordinary skill in the art will understand that the embodiments of the invention may be practiced without employing these specific details. Indeed, the embodiments of the invention may be practiced in conjunction with conventional semiconductor fabrication techniques employed in the industry. In addition, the description provided below does not form a complete process flow for manufacturing a semiconductor device in which the conductive structure is present, and the semiconductor devices described below do not form a complete electronic device. Only those process acts and conductive structures or semiconductor devices necessary to understand the embodiments of the invention are described in detail below. Additional processing acts to form a complete semiconductor device from the conductive structures or to form a complete electronic device from the semiconductor device may be performed by conventional fabrication techniques, which are not described herein.

The materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. Furthermore, while the materials described and illustrated herein may be formed as layers, the materials are not limited thereto and may be formed in other three-dimensional configurations.

Reference will now be made to the drawing figures, wherein like numerals represent like elements. The figures are not necessarily drawn to scale.

FIGS. 2A-2E are partial cross-sectional schematic views illustrating a method of forming a semiconductor structure 200. The semiconductor structure 200 may include a substrate 202 having a contact 204 formed therein, an optional barrier material, an insulative material 208 and an organic material 210. The substrate 202, as previously discussed, may be a full or partial wafer of semiconductor material or a material such as glass or sapphire. The contact 204 may be formed in the substrate 202 from a conductive material, such as polysilicon, using conventional patterning and deposition methods, which are not described in detail herein. By way of non-limiting example, the contact 204 may be formed from a conductive material, such as polysilicon, titanium nitride, rhodium, ruthenium, iridium, or combinations thereof, and may be used to electrically couple a metal-insulator-metal (MIM) storage capacitor to one or more associated transistor devices or conductive lines, which will be described in detail below.

The barrier material (not shown), if present, may be formed over and in contact with surfaces of the substrate 202 and the contact 204. The barrier material may include, for example, a nitride material, such as titanium nitride (TiN), tantalum nitride (TaN) or tantalum silicon nitride (TaSiN). The barrier material may additionally include an oxygen barrier material (not shown) including, for example, rhodium oxide, iridium, or a metal doped with silicon dioxide.

The insulative material 208 may be formed over and in contact with the substrate 202, the contact 204 and the barrier material, if present. By way of non-limiting example, the insulative material 208 may be formed from silicon dioxide, phosphosilicate glass (PSG), borosilicate glass (BSG), and borophosphosilicate glass (BPSG).

The organic material 210 may be formed over and in contact with the insulative material 208 and may include, for example, a polymer material. The organic material 210 may be a material that prevents nucleation and growth of a conductive material thereon. By way of non-limiting example, the organic material 210 may be a photoresist material that includes a diazonaphthoquinone-based material, a polyhydroxystyrene-based material, a phenol formaldehyde-based material or an epoxy-based material. Additionally, the organic material 210 may include a polymer such as polystyrene (PS), polyethylene (PE), polypropylene (PP), polychloroprene (CR), a polyvinyl ether, poly(vinyl acetate) (PVAc), poly(vinyl chloride) (PVC), a polysiloxane, a poly(methyl methacrylate) (PMMA), a polyurethane (PU), a polyacrylate, a polyacrylamide, novolak, polymethylglutarimide (PMGI), polymethylsilane (PMS), non-aromatic polymers, polycycloolefin, and copolymers and mixtures thereof. The organic material 210 may be applied over the insulative material 208 by any suitable technique such as, for example, spin casting, spin coating, spraying, ink coating, or dip coating. The organic material 210 may be formed to prevent deposition of a conductive material thereon, which will be described in further detail below. As a non-limiting example, the organic material 210 may be formed from a polymer material that does not include a hydroxyl group and may be formed at a thickness of greater than the average thickness of one monolayer of the polymer material. The organic material 210 may include an aperture 212 therein that exposes a surface of the insulative material 208. The aperture 212 may be formed by patterning the organic material 210 using conventional techniques, which are not described in detail herein.

Figure 2A:
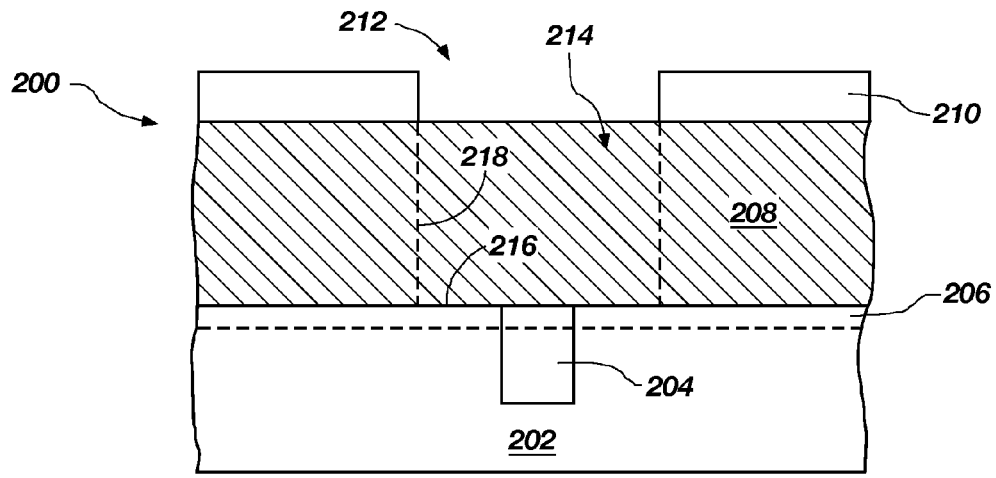
FIGS. 2A-2E are partial cross-sectional views illustrating an embodiment of a method that may be used to fabricate a conductive material on a semiconductor structure.

Referring still to FIG. 2A, an opening 214 (shown in broken lines) may be formed in the semiconductor structure 200 by removing at least a portion of the insulative material 208 exposed through the aperture 212 in the organic material 210. If the opening 214 extends through the insulative material 208, the opening 214 may be defined by an upper surface 216 of the substrate 202 and the contact 204, and sidewalls 218 of the insulative material 208. If the opening 214 extends partially into the insulative material 208, the opening 214 may be defined by an upper surface of the remaining portion of the insulative material 208, and sidewalls 218 of the insulative material 208. By way of non-limiting example, the opening 214 may be formed as a cup-shaped container, as shown by broken lines in FIG. 2A, and may have a variety of cross-sectional shapes, such as circular, square, rectangular, trapezoidal, triangular, oval, or rhomboidal. For example, the opening 214 may be formed to have a feature size or a critical dimension of less than about 50 nm and may have an aspect ratio of greater than about 40:1.

In one embodiment, the barrier material, if present, is titanium nitride, the insulative material 208 is silicon dioxide, and the organic material 210 is a photoresist material including a mixture of a phenol-formaldehyde polymer and naphthoquinone diazides. A fluorine-containing etchant, such as a solution including hydrofluoric acid, or a plasma including tetrafluoromethane ($CF_4$), or hexafluorobutadiene ($C_4F_6$), may be used to remove the insulative material 208 and form the opening 214 without removing the barrier material, if present, or the organic material 210. For the sake of clarity, the semiconductor structure 200 depicted in the following drawings includes a single opening 214 extending through a thickness of the insulative material 208 to the barrier material, if present, or, alternatively, to the substrate 202 and the contact 204. However, in other embodiments, a plurality of openings 214 may be formed in the semiconductor structure 200. Additionally, the openings 214 may be extended into any underlying materials such as the barrier material or the substrate 202. The opening 214 may be positioned to facilitate access between the contact 204 and additional structures, which may include conductive regions, such as transitors or conductive lines, which will be described in further detail below.

After removing a portion of the insulative material 208 to form the opening 214, the surfaces exposed by the opening 214 may be cleaned. To clean the exposed surfaces, the semiconductor structure 200 may be exposed to an etching process that removes residues, such as organic residues, and substantially evens out roughness on surfaces of the insulative material 208 and the substrate 202 without substantially removing the organic material 210. For example, a wet etching process using a hydrogen fluoride (HF)-containing solution, or a dry etching process using a plasma including ozone ($O_3$) may be used. As a non-limiting example, a solution including a mixture of hydrogen fluoride and ammonium fluoride ($NH_4F$) at a ratio of about 100:1 may be applied to the surfaces exposed by the opening 214 for about 1 minute to clean the surfaces thereof. Cleaning the semiconductor structure 200 may remove polymers, organic material and other residues from the sidewalls 218 of the insulative material 208, and the upper surface 216 of the barrier material, if present, or the contact 204 and the substrate 202 within the opening 214. Removal of these residues may facilitate deposition of materials, such as platinum, as will be described in further detail.

Figure 2B:
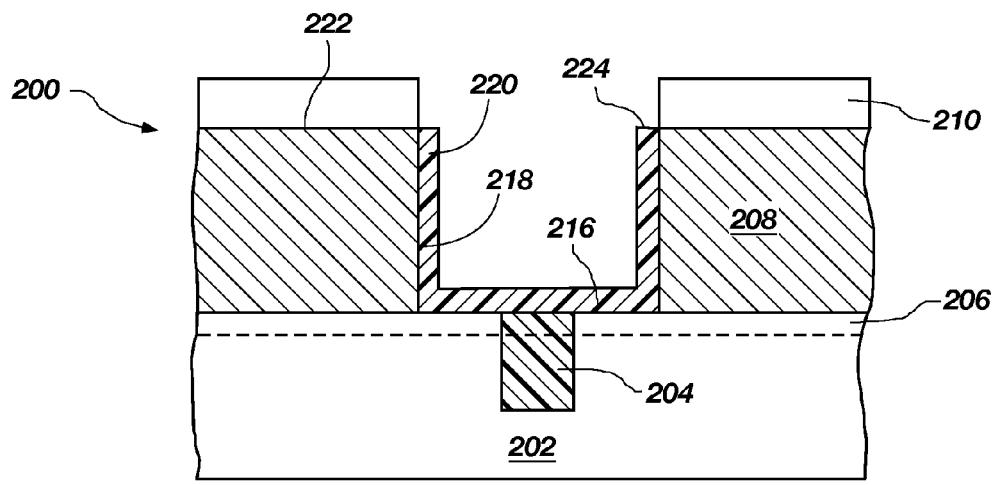

Referring to FIG. 2B, after cleaning the semiconductor structure 200, a conductive material 220 may be formed on the sidewalls 218 of the insulative material 208, and the upper surface 216 of the substrate 202 and the contact 204 or the barrier material, if present, without being formed on the surfaces 222 of the semiconductor structure 200, which are protected by the organic material 210. The conductive material 220 may be conformally deposited using an ALD process. For example, an ALD process may be performed by exposing the semiconductor structure 200 to a precursor gas that reacts with the insulative material 208, the substrate 202, or the barrier material, if present, but does not react with the organic material 210. By utilizing an ALD process, a single monolayer of the conductive material 220 may be formed at a time. During the ALD process, growth of the conductive material 220 is controlled by self-limiting surface reactions between exposed surfaces and the precursor gas. The ALD process enables controlled deposition of one or more monolayers of the conductive material 220. The formation of the conductive material 220 by ALD may be performed at sufficiently low temperatures so that the organic material 210 remains intact and is not damaged or degraded. As such, the organic material 210 may function as a mask to protect underlying regions of the insulative material 208. Without being bound by any particular theory, it is believed that the organic material 210 may prevent reactions between the surface 222 of the insulative material 208 and the precursor gas from occurring, which prevents nucleation and growth of the conductive material 220 on the surface 222 during the ALD process.

The conductive material 220 may be, for example, platinum, titanium, tantalum, iridium, rhodium, ruthenium, copper, an oxide or nitride thereof, combinations thereof, or an alloy thereof. ALD precursor gases suitable for producing these conductive materials are known in the art and, therefore, are not described in detail herein. As a non-limiting example, the conductive material 220 may be deposited to a thickness in a range of from about 20 Å to about 300 Å. For simplicity, the conductive material 220 is depicted as including a single layer. However, in some embodiments, the conductive material 220 may be formed from a plurality of layers. To deposit the conductive material 220, the semiconductor structure 200 may be exposed to the precursor gas in a reaction chamber for a sufficient amount of time to form a desired thickness of the conductive material 220. The reaction chamber may be maintained at a temperature in a range of from about 50° C. to about 300° C. and at a constant pressure or a variable pressure in a range of from about 0.0001 torr to about 5 torr.

By way of non-limiting example, if platinum is the desired conductive material 220, the precursor gas may include, but is not limited to, (trimethyl)methylcyclopentadienyl platinum (Pt10), (trimethyl)cyclopentadienyl ($C_5H_5$)Pt($CH_3$)$_3$, Pt(acetylacetonate)2, Pt($PF_3$)$_4$, Pt(CO)$_2$Cl$_2$, cis-[Pt($CH_3$)$_2$(($CH_3$)NC)$_2$], or platinum hexafluorocetylacetonate. The precursor gas may be flowed into the opening 214 to form platinum on exposed surfaces of the insulative material 208, contact 204, the substrate 202, and the barrier material, if present, without forming platinum on surfaces covered by the organic material 210. Stated another way, the platinum may be selectively deposited on exposed surfaces of the semiconductor structure 200, except for on exposed surfaces of the organic material 210.

By using the organic material 210 to prevent deposition of the conductive material 220 on the surfaces 222 of the semiconductor structure 200, a surface 224 of the conductive material 220 may be formed to be substantially coplanar with the surface 222 of the insulative material 208 without the use of additional planarization or etching acts. Since the conductive material 220 is substantially free of defects or deformations, additional materials formed on the semiconductor structure 200 may be substantially free of defects. Furthermore, by protecting the surfaces 222 of the insulative material 208 with the same organic material 210 used to form the openings 214 (FIG. 2A), further processing acts are not used to form the conductive material 220 on desired locations of the semiconductor structure 200. Thus, the present method provides for deposition of the conductive material 220 without further masking and etching acts, reducing the time and expense of fabricating the semiconductor structure 200.

Although the conductive material 220 is illustrated herein as being selectively formed within the opening 214 in the semiconductor structure 200, a similar process may be used to selectively deposit the conductive material 200 on a variety of other surfaces and structures having differing topographies, as would be recognized by one of ordinary skill in the art. As a non-limiting example, the conductive material 220 may be formed in the aperture 212, shown in FIG. 2A, or the conductive material 220 may be formed on exposed surfaces of other materials having portions thereof protected by the organic material 210.

Figure 2C:
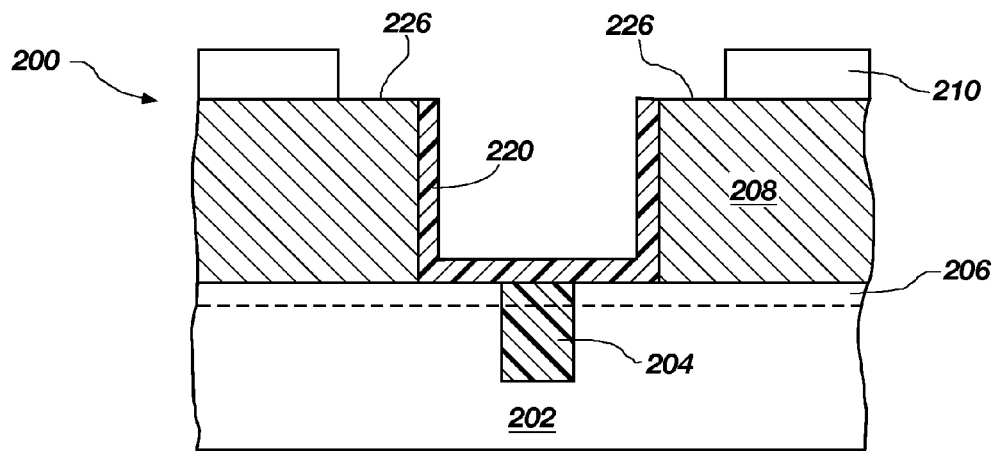

Referring to FIG. 2C, after forming the conductive material 220, a portion of the organic material 210 may be removed to expose a surface 226 of the insulative material 208 where it is desired to form a capacitor structure. The surface 226 of the insulative material 208 may be exposed by using conventional patterning techniques (e.g., masking and etching) to remove the desired portion of the organic material 210.

Figure 2D:
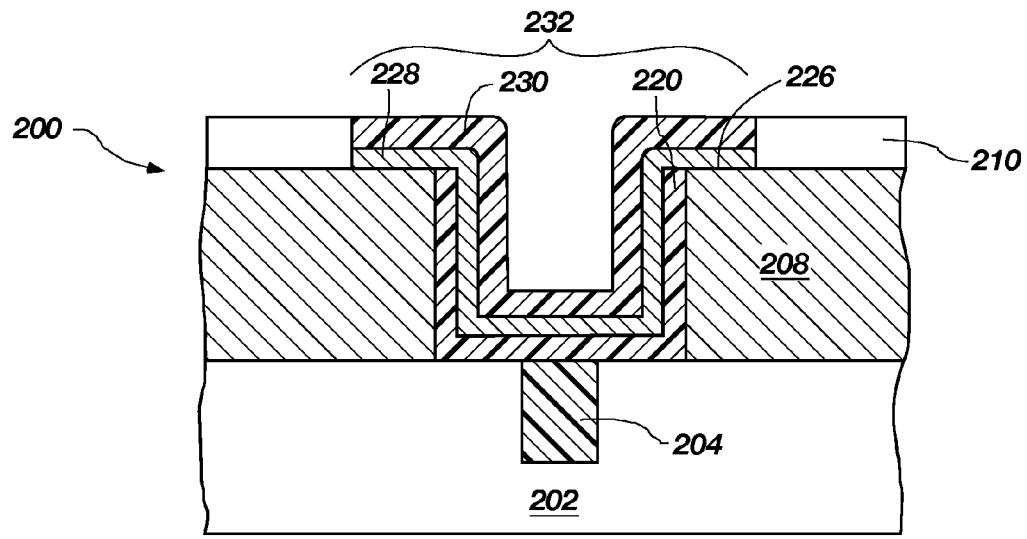

As shown in FIG. 2D, a dielectric material 228 may be applied over and in contact with the conductive material 220 and the surface 226 of the insulative material 208, after which another conductive material 230 may be applied over and in contact with the dielectric material 228 to form a capacitor structure 232. As a non-limiting example, the dielectric material 228 may be a material with a high dielectric constant, such as tantalum oxide, tantalum pentoxide ($Ta_2O_5$), strontium titanate ($SrTiO_3$), barium strontium titanate (BST), or silicon oxynitride (SiON), and may be formed using, for example, CVD or PVD. The another conductive material 230 may include, for example, platinum, titanium, tantalum, iridium, rhodium, ruthenium, an oxide or nitride thereof, combinations thereof, or an alloy thereof. The another conductive material 230 may be formed using a process such as CVD or PVD. For simplicity, the another conductive material 230 is depicted as including a single layer. However, in some embodiments, the another conductive material 230 may include a plurality of layers of a metal or other conductive material. By way of non-limiting example, the another conductive material 230 may be platinum and may be selectively formed on the dielectric material 228 relative to the remaining portions of the organic material 210, as previously described.

Figure 2E:
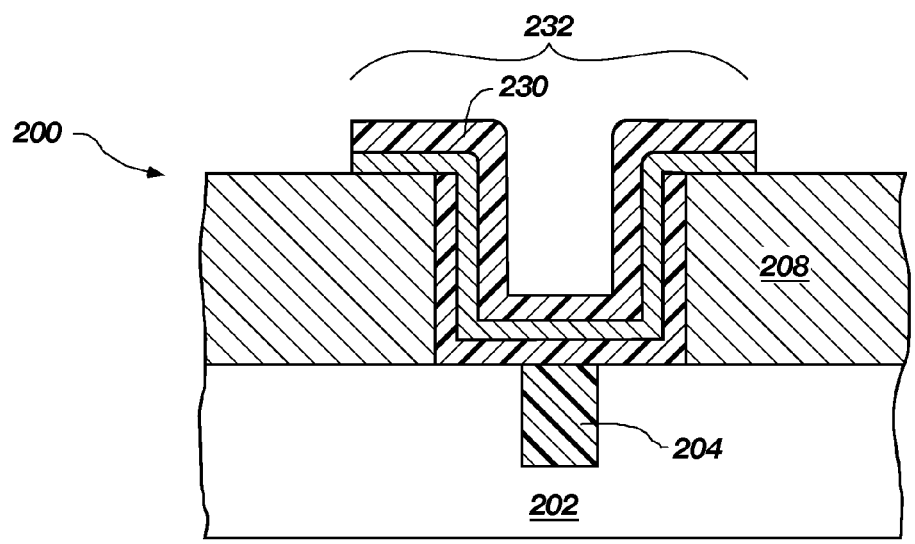

Referring to FIG. 2E, after forming the capacitor structure 232, the organic material 210 and the insulative material 208 may be removed. As a non-limiting example, if the organic material 210 is a photoresist material, a conventional ashing process may be used to remove the photoresist material without damaging or degrading the another conductive material 230 or the insulative material 208. Additionally, an isotropic etching process (e.g., a wet chemical etch or a partially isotropic reactive ion etch (RIE)) may be used to remove the insulative material 208 selective to the another conductive material 230. For example, if the dielectric material 208 includes silicon dioxide and the another conductive material 230 includes platinum, a wet etching process selectively removes platinum relative to the silicon dioxide.

Figure 3:
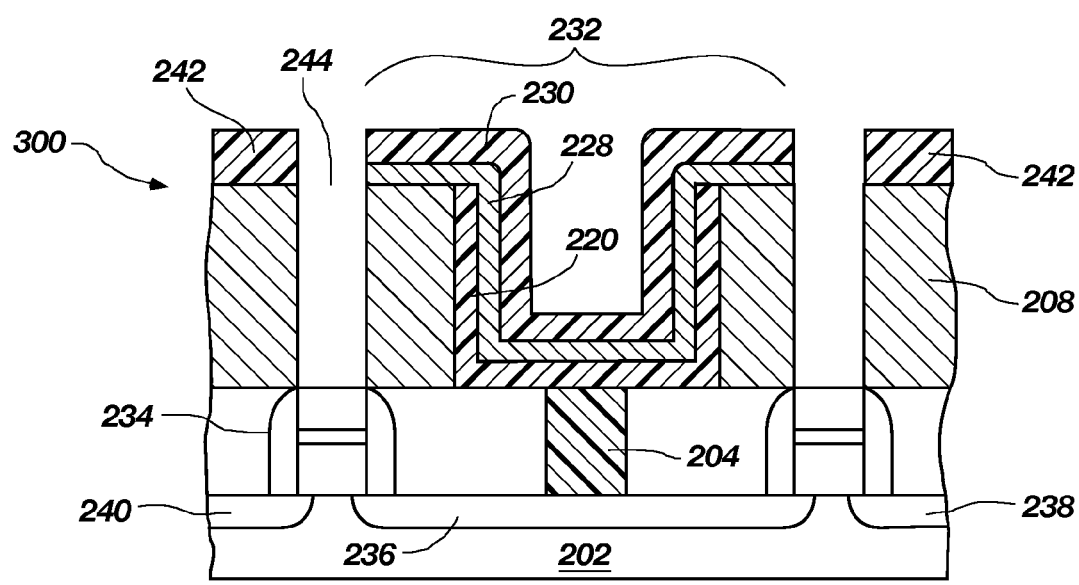
FIG. 3 is a partial cross-sectional view illustrating an embodiment of a method for forming contact holes in a semiconductor device.

As shown in FIG. 3, a semiconductor device 300 may be provided that includes a plurality of capacitor structures 232 as adjacent mask structures 242. The semiconductor device 300 may include the insulative material 208 overlying the substrate 202, the contact 204, and the capacitor structure 232 that includes the conductive material 220, the dielectric material 228 and the another conductive material 230, such as that shown in FIG. 2D. The semiconductor device 300 may additionally include transistor devices 234 formed relative to a source region 236, a drain region 238, and a field oxide region 240. The transistor devices 234 may be formed by conventional techniques, which are not described in detail herein. An anisotropic dry reactive ion (i.e., plasma) etching process or a wet chemical etching process may be performed to remove a portion of the insulative material 208 relative to the another conductive material 230 and adjacent mask structures 242 to expose a region of the transistor devices 234. The removed portion of the insulative material 208 may form a contact hole 244. The adjacent mask structures 242 may each include a capacitor structure 232 formed by the methods described above with reference to FIGS. 2A-2D. In some embodiments, at least one of the transistor devices 234 may be in electrical communication with at least one conductive line (not shown). The conductive line may be formed by conventional techniques, which are not described in detail herein.

While the invention may be susceptible to various modifications and alternative forms, specific embodiments have been shown by way of example in the drawings and have been described in detail herein. However, it should be understood that the invention is not limited to the particular forms disclosed. Rather, the invention encompasses all modifications, variations and alternatives falling within the scope of the invention as defined by the following appended claims and their legal equivalents.

What is claimed is:

1. A method of forming a conductive material, the method comprising:
    forming at least one opening extending through an organic material and an insulative material underlying the organic material to expose at least a portion of a substrate and a conductive contact in the substrate;
    lining exposed surfaces of the insulative material, the conductive contact, and the at least a portion of the substrate in the at least one opening with a conductive material without forming the conductive material on the organic material; and
    forming a dielectric material over the conductive material, and forming another conductive material over the dielectric material to form at least one capacitor structure.

2. The method of claim 1, further comprising removing the organic material.

3. The method of claim 2, further comprising utilizing the at least one capacitor structure as a mask to remove an adjacent portion of the insulative material without removing the another conductive material.

4. The method of claim 3, wherein removing an adjacent portion of the insulative material comprises exposing transistor devices in the substrate.

5. A method of forming a conductive material, comprising:
    removing a portion of each of an organic material and an underlying material to form at least one opening extending through the organic material and the underlying material and exposing surfaces of a substrate and a conductive contact;
    conformally forming a conductive material on exposed surfaces of the underlying material, the substrate, and the conductive contact without forming the conductive material on the organic material; and
    forming a dielectric material over the conductive material, and forming another conductive material over the dielectric material to form at least one capacitor structure.

6. The method of claim 5, wherein conformally forming a conductive material on the exposed surfaces of the underlying material, the substrate, and the conductive contact without forming the conductive material on the organic material comprises forming the conductive material over the exposed surfaces of the underlying material, the substrate, and the conductive contact without substantially filling the at least one opening.

7. The method of claim 5, wherein removing a portion of each of an organic material and an underlying material comprises removing a portion of an organic material selected from the group consisting of polystyrene (PS), polyethylene (PE), polypropylene (PP), polychloroprene (CR), a polyvinyl ether, poly(vinyl acetate) (PVAc), poly(vinyl chloride) (PVC), a polysiloxane, a poly(methyl methacrylate) (PMMA), a polyurethane (PU), a polyacrylate, a polyacrylamide, novolak, polymethylglutarimide (PMGI), polymethylsilane (PMS), non-aromatic polymers, polycycloolefin, and copolymers and mixtures thereof.

8. The method of claim 5, wherein removing a portion of each of an organic material and an underlying material comprises removing a portion of an organic material selected from the group consisting of a diazonaphthoquinone-based material, a polyhydroxystyrene-based material, a phenol formaldehyde-based material, and an epoxy-based material.

9. The method of claim 5, further comprising cleaning surfaces exposed by the at least one opening, prior to conformally forming the conductive material on exposed surfaces of the underlying material, the substrate, and the conductive contact without forming the conductive material on the organic material.

10. The method of claim 9, wherein cleaning surfaces exposed by the at least one opening comprises subjecting the surfaces exposed by the at least one opening to at least one of a solution comprising hydrogen fluoride and a plasma comprising ozone.

11. The method of claim 5, wherein conformally forming a conductive material on exposed surfaces of the underlying material, the substrate, and the conductive contact without forming the conductive material on the organic material comprises conformally forming the conductive material by atomic layer deposition.

12. The method of claim 11, wherein conformally forming the conductive material by atomic layer deposition comprises selectively reacting a precursor gas with the exposed surfaces of the underlying material, the substrate, and the conductive contact without reacting the precursor gas with the organic material.

13. The method of claim 5, wherein conformally forming a conductive material on exposed surfaces of the underlying material, the substrate, and the conductive contact comprises forming platinum, titanium, tantalum, iridium, rhodium, ruthenium, copper, an oxide or nitride thereof, combinations thereof, or an alloy thereof on the exposed surfaces of the underlying material, the substrate, and the conductive contact.

14. A method of forming a conductive structure, the method comprising:
removing portions of each of an organic material and an insulative material underlying the organic material to form at least one opening in the insulative material, the at least one opening exposing a surface of a conductive contact;
subjecting the insulative material and the surface of the conductive contact to a precursor gas configured to react with the insulative material and the surface of the conductive contact to form a first conductive material on sidewalls of the insulative material within the at least one opening and on the surface of the conductive contact exposed between the sidewalls of the insulative material, without forming the first conductive material on the organic material;
forming a dielectric material over and in contact with the first conductive material; and
forming a second conductive material over and in contact with the dielectric material to form at least one capacitor structure.

15. The method of claim 14, further comprising applying an etchant configured to remove organic residues on the surface of the conductive contact before subjecting the insulative material and the surface of the conductive contact to the precursor gas.

16. The method of claim 14, wherein forming the first conductive material on the sidewalls of the insulative material within the at least one opening and on the surface of the conductive contact exposed between the sidewalls of the insulative material without founing the first conductive material on the organic material comprises:
forming a conductive material comprising at least one of platinum, iridium, rhodium, ruthenium, and copper on the sidewalls of the insulative material within the at least one opening and on the surface of the conductive contact exposed between the sidewalls of the insulative material.

17. The method of claim 16, wherein forming a conductive material comprising at least one of platinum, iridium, rhodium, ruthenium, and copper on the sidewalls of the insulative material within the at least one opening and on the surface of the conductive contact exposed between the sidewalls of the insulative material comprises forming the conductive material by atomic layer deposition.

18. The method of claim 14, wherein subjecting the insulative material and the surface of the conductive contact to a precursor gas configured to react with the insulative material and the surface of the conductive contact comprises reacting a platinum precursor gas with the insulative material and the surface of the conductive contact to form platinum thereon without reacting the platinum precursor gas with the organic material.

19. The method of claim 18, wherein reacting a platinum precursor gas with the insulative material and the surface of the conductive contact comprises reacting the platinum precursor gas selected from the group consisting of (trimethyl)methylcyclopentadienyl platinum, (trimethyl)cyclopentadienyl $(C_5H_5)Pt(CH_3)_3$, $Pt(acetylacetonate)_2$, $Pt(PF_3)_4$, $Pt(CO)_2Cl_2$, cis-$[Pt(CH_3)_2((CH_3)NC)_2]$, and platinum hexafluoroacetylacetonate with the insulative material and the surface of the conductive contact.

* * * * *